(12) United States Patent
Panchal

(10) Patent No.: US 7,444,534 B2
(45) Date of Patent: Oct. 28, 2008

(54) METHOD AND APPARATUS FOR DIVIDING A DIGITAL SIGNAL BY X.5 IN AN INFORMATION HANDLING SYSTEM

(75) Inventor: Neil A. Panchal, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 453 days.

(21) Appl. No.: 11/339,589

(22) Filed: Jan. 25, 2006

(65) Prior Publication Data

US 2007/0174648 A1 Jul. 26, 2007

(51) Int. Cl.
*G06F 1/00* (2006.01)

(52) U.S. Cl. .................. 713/500; 713/501; 327/115; 327/117; 377/47; 377/48

(58) Field of Classification Search .................. 713/500, 713/501; 327/115, 117; 377/47, 48
See application file for complete search history.

(56) References Cited

U.S. PATENT DOCUMENTS

| | | | |
|---|---|---|---|
| 4,041,403 A * | 8/1977 | Chiapparoli, Jr. ............. | 377/48 |
| 5,442,670 A * | 8/1995 | Shu .............................. | 377/48 |
| 6,489,817 B1 | 12/2002 | Wong et al. | |
| 6,570,417 B2 * | 5/2003 | Choi et al. .................. | 327/115 |
| 6,879,654 B2 | 4/2005 | Austin | |
| 6,882,190 B2 * | 4/2005 | Choi et al. .................. | 327/115 |
| 6,882,229 B1 | 4/2005 | Ho et al. | |
| 7,034,584 B2 * | 4/2006 | Choi et al. .................. | 327/115 |
| 2003/0117187 A1 * | 6/2003 | Choi et al. .................. | 327/115 |
| 2004/0150437 A1 * | 8/2004 | Choi et al. .................. | 327/117 |
| 2004/0213369 A1 * | 10/2004 | Austin ......................... | 377/47 |
| 2005/0156639 A1 * | 7/2005 | Choi et al. .................. | 327/115 |

OTHER PUBLICATIONS

GRAF—Divide by 1-1/2 Circuit—downloaded Oct. 6, 2005 from DesignNotes.com.

* cited by examiner

*Primary Examiner*—Thomas Lee
*Assistant Examiner*—Jaweed A Abbaszadeh
(74) *Attorney, Agent, or Firm*—Diana Gerhardt; Mark P Kahler

(57) ABSTRACT

An information handling system including a divider circuit is disclosed that divides an input clock signal by a non integer value to generate an output clock signal. The resultant output clock signal exhibits a 50/50 duty cycle in one embodiment. The disclosed divider methodology permits the design of advanced circuit functions, such as double data rate memory operations, without the need for additional clock signal sources.

3 Claims, 7 Drawing Sheets

METHOD AND APPARATUS FOR DIVIDING A DIGITAL SIGNAL BY X.5 IN AN INFORMATION HANDLING SYSTEM

TECHNICAL FIELD OF THE INVENTION

The disclosures herein relate generally to divider circuits, and more particularly, to divider circuits that divide digital signals by non-integer divisors in digital systems.

BACKGROUND

Digital clock signals play important roles in information handling systems (IHSs) such as desktop, laptop, notebook, personal digital assistant (PDA), server, mainframe, minicomputer and communication systems, and other systems that employ digital electronics. For example, a microprocessor in an IHS employs a clock signal as a time base or reference. In actual practice, IHSs typically employ multiple clock signals that all relate to a common system clock signal, namely a master clock signal.

A practical IHS may include hardware that generates multiple clock signals from a common system clock or master clock signal. The master clock signal acts as the primary timing reference for the IHS. The other clock signals in the IHS relate to the master clock signal in timing, frequency and pulse width. Moreover, the rising and falling edges of the other clock signals may relate to the rising and falling edges of the master clock signal to provide the proper timing of operations within the IHS. In the simplest case, the other clock signals relate to the master clock signal by an integer multiple. For example, the other clock signals may exhibit a frequency twice or three times that of the master clock signal.

It is also possible for a clock circuit to divide the master clock signal by an integer divisor to produce a clock signal exhibiting a lower frequency than the master clock signal. For example, a divide by 2 clock circuit divides the master clock signal by 2 to generate a clock signal that exhibits a frequency ½ the system clock frequency. Typically, the resultant clock signal exhibits a 50/50 duty cycle. In other words, one half cycle of the clock signal exhibits a logic high while the next half cycle of the clock signal exhibits a logic low. Divide by 2 clock circuits with 50/50 duty cycles are common. Clock circuits with 50/50 duty cycles and employing integer divisors other than 2, for example divisors of 3, 4, or 5, are also common.

A less common clock circuit is the "divide by X.5" clock circuit in which clock circuitry divides a master clock signal or system clock signal by a divisor, X.5, wherein X describes an integer greater than or equal to 2. For example, clock circuits may employ divisors of 2.5, 3.5, 4.5, etc. to divide the master clock signal to produce a resultant divided down clock signal. A divide by X.5 clock circuit is useful in complex integrated circuits that perform memory addressing, memory data management and a wide variety of other integrated circuit functions as well. Divide by X.5 clock circuits are known that exhibit duty cycles other than 50/50. However, some applications require 50-50 duty cycle clock signals. For example, double data rate memory systems require 50-50 duty cycle clock signals because these systems launch and capture data on both the rising and falling edges of a clock signal. Timing requirements in many high-speed applications mandate a clock signal that maintains an ideal 50-50 duty cycle.

What is needed is a method and apparatus that divides a clock signal by a non-integer divisor to provide an output signal exhibiting a 50/50 duty cycle.

SUMMARY

Accordingly, in one embodiment, a method of processing a signal by a divider circuit is disclosed. The method includes receiving, by a divider input of the divider circuit, a clock input signal including a plurality of pulses exhibiting a frequency CLKIN FREQ. The method also includes generating, by divider logic coupled to the divider input, a clock output signal at a divider output of the divider circuit, the clock output signal including a plurality of pulses exhibiting a clock frequency CLKOUT FREQ, the frequency CLKOUT FREQ being equal to the frequency CLKIN FREQ divided by X.5, wherein X is an integer at least equal to 2. The step of generating a clock output signal also includes generating, by a variable duty cycle pulse generator, a pulse signal A exhibiting a frequency A FREQ according to the relationship A FREQ=CLKIN FREQ/(2×(X.5)), wherein pulse signal A includes a plurality of pulses having rising and falling edges. The step of generating a clock output signal further includes generating, by time delay logic, a time delayed copy of pulse signal A which is designated pulse signal B, wherein pulse signal B includes a plurality of pulses having rising and falling edges. The step of generating a clock output signal still further includes generating, by phase delay logic, a phase delayed copy of signal A and a phase delayed copy of signal B, the phased delayed copies of signal A and signal B being delayed in phase by a predetermined phase amount. The step of generating a clock output signal further includes generating, by output logic coupled to the divider output, the clock output signal including a plurality of even and odd pulses, wherein the even and odd pulses include rising edges that are generated in response to rising edges of pulse signal A and pulse signal B, respectively, and wherein the even and odd pulses include falling edges that are generated in response to falling edges of the phase delayed copies of pulse signal A and pulse signal B, respectively.

In another embodiment, a divider circuit is disclosed that includes a divider input adapted to receive a clock input signal including a plurality of pulses exhibiting a frequency CLKIN FREQ. The divider circuit also includes a divider output at which a clock output signal including a plurality of pulses exhibiting a clock frequency CLKOUT FREQ is generated, the frequency CLKOUT FREQ being equal to the frequency CLKIN FREQ divided by X.5, wherein X is an integer at least equal to 2. The divider circuit further includes divider logic, coupled between the divider input and the divider output. The divider logic forms the clock output signal by generating, with a variable duty cycle pulse generator, a pulse signal A exhibiting a frequency A FREQ according to the relationship A FREQ=CLKIN FREQ/(2×(X.5)), wherein pulse signal A includes a plurality of pulses having rising and falling edges. The divider logic further forms the clock output signal by generating, with time delay logic, a time delayed copy of pulse signal A which is designated pulse signal B, wherein pulse signal B includes a plurality of pulses having rising and falling edges. The divider logic still further forms the clock output signal by generating, with phase delay logic, a phase delayed copy of signal A and a phase delayed copy of signal B, the phased delayed copies of signal A and signal B being delayed in phase by a predetermined phase amount. The divider logic still further forms the clock output signal by generating, with output logic coupled to the divider output, the clock output signal including a plurality of even and odd pulses, wherein the even and odd pulses include rising edges that are generated in response to rising edges of pulse signal A and pulse signal B, respectively, and wherein the even and odd pulses include falling edges that are generated in response to falling edges of the phase delayed copies of pulse signal A and pulse signal B, respectively.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Figure 1:
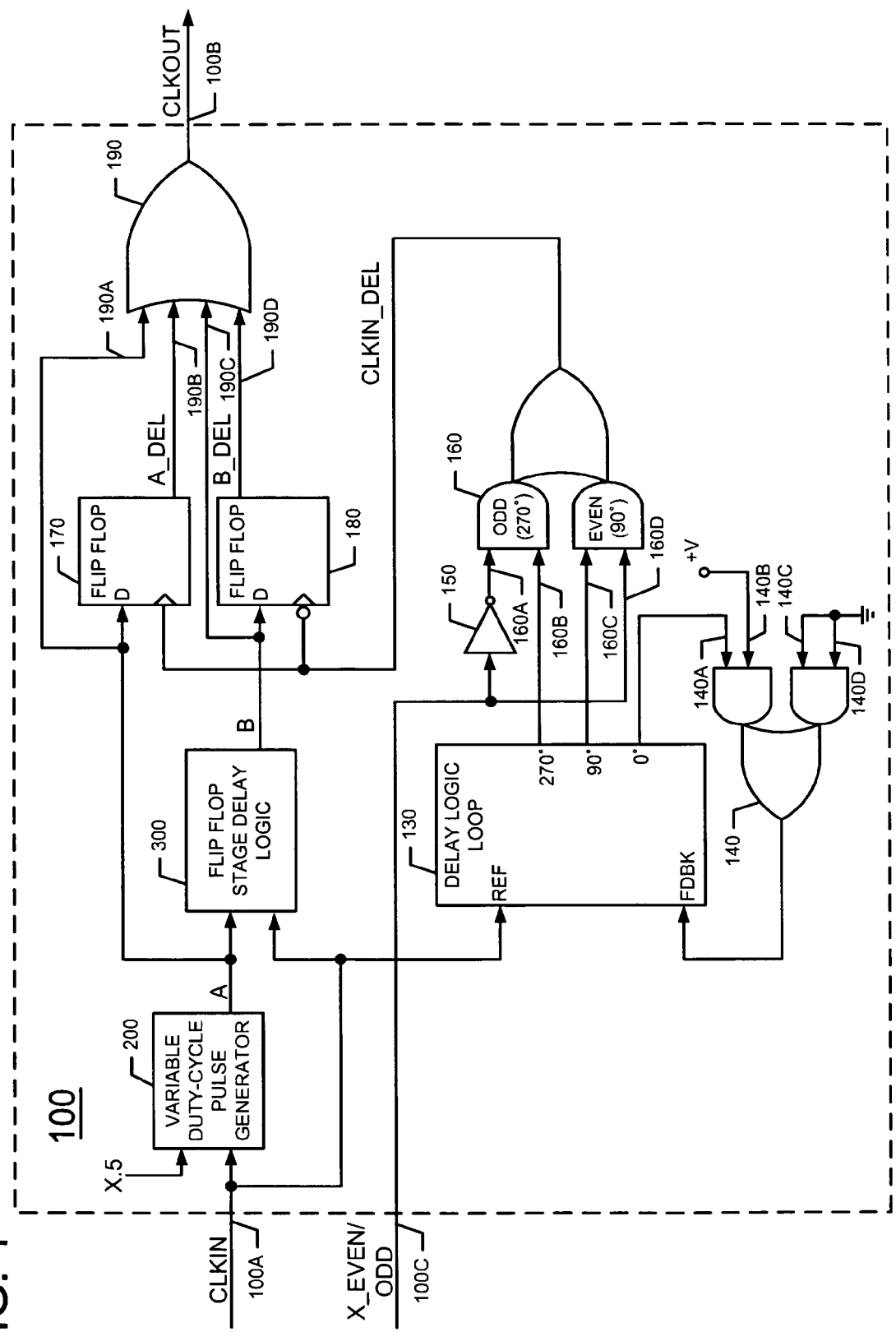
FIG. 1 shows a block diagram of the disclosed divider circuit.

FIG. 1 shows a clock circuit 100 that receives a master or reference clock signal, CLKIN, at input 100A. In response to the CLKIN reference clock signal, clock circuit 100 divides the CLKIN signal frequency by the divisor X.5 to generate a divided-down clock output signal, CLKOUT, at output 100B. Clock circuit 100 includes a variable duty-cycle pulse generator 200 having an input coupled to input 100A to receive the reference clock CLKIN. The input of variable duty-cycle pulse generator 200 also couples to a reference input, REF, of a delay logic loop 130 and an input of a flip flop stage delay logic circuit 300. In more detail, variable duty-cycle pulse generator 200 generates a clock signal A at its output. The output of generator 200 couples to the input of a flip flop stage delay logic circuit 300, to the D input of a rising edge clock triggered flip flop 170 and to one of four inputs 190A of an OR gate 190. OR gate 190 generates the output clock signal CLKOUT as per Equation 1 below:

$$\text{CLKOUT FREQ} = \text{CLKIN FREQ}/X.5 \qquad \text{EQUATION 1}$$

wherein X=an integer greater than or equal to 2

As mentioned above, variable duty-cycle pulse generator 200 generates a clock signal A at its output. Variable duty-cycle pulse generator 200 reduces the frequency of the reference clock, CLKIN FREQ, in accordance with the timing relationship in Equation 2 below wherein A FREQ represents the frequency of the resultant output clock signal A.

$$\text{A FREQ} = \text{CLKIN FREQ}/(2 \times (X.5)) \qquad \text{EQUATION 2}$$

Variable duty-cycle pulse generator 200 divides the frequency of the reference clock, CLKIN FREQ by (2 times X.5), to enable divider circuit 100 to generate an output clock signal, CLKOUT, exhibiting a frequency equal to CLKIN FREQ divided by X.5, wherein X equals any integer equal to or greater than 2. In one example wherein X equals the integer 3, clock signal A exhibits a frequency, A FREQ, defined as CLKIN FREQ divided by (2 times X.5, namely 2 times 3.5, or 7). In other words, signal A exhibits a frequency, A FREQ, divided by 7. In this example clock signal A will repeat every 7 occurrences of the rising edge of reference clock CLKIN. Stated alternatively, clock signal A exhibits a frequency 7 times slower than the frequency of the reference clock, CLKIN FREQ. Clock signal A, as described in more detail in the timing diagrams discussed below, exhibits a rising edge timing relationship matching that of the rising edges of reference signal CLKIN.

Flip flop stage delay logic circuit 300 includes two inputs to which circuit 100 provides the reference clock signal CLKIN and clock signal A, respectively. In response, flip flop stage delay logic circuit 300 generates a clock signal B at its output. The frequency of clock signal B, namely B FREQ, equals the frequency of clock signal A, namely A FREQ. Clock signal B represents a delayed copy of signal A referenced to the falling edge of system clock input CLKIN. The output of flip flop stage delay logic circuit 300 couples to the D input of a falling clock edge triggered flip flop 180 and to input 190C of OR gate 190. Clock signal B exhibits the same pulse width, namely the period of time that signal B exhibits a high state, as clock signal A. Moreover, flip flop stage delay logic circuit 300 delays clock signal B with respect to clock signal A by the number of flip flops which form flip flop stage delay logic 300. Flip flop stage delay logic circuit 300 is described in more detail below.

Divider circuit 100 supplies the reference CLKIN signal to the reference input, REF, of a delay logic loop 130. Delay logic loop 130 generates delayed copies of the CLKIN reference clock signal. Delay logic loop 130 generates a copy of the CLKIN signal delayed by 270 degrees at the output designated 270°, a copy of the CLKIN signal delayed by 90 degrees at the output designated 90°, and finally a copy of the CLKIN signal delayed by 0° at the output designated 0°. Thus, 270°, 90° and 0° represent the respective timing offsets imposed on the CLKIN signal by delay logic loop 130. More particularly, delay logic loop 130 generates the delay signals 270°, 90°, and 0° as identical waveforms in terms of pulse width and frequency, however exhibiting rising and falling edge orientations with a delay or right-shift based on the frequency of reference clock CLKIN. The period in time of a repetitive waveform equals the reciprocal of that waveform's relative frequency. The period of reference clock CLKIN is the time between one rising edge of the reference clock CLKIN and the next rising edge of reference clock CLKIN. The 0° output of delay logic loop 130 couples to one of four inputs of an AND/OR logic gate 140, namely to input 140A. AND/OR gate 140 compensates or matches the delay exhibited by the 270° and 90° outputs of delay logic loop 130. Delay logic loop 130 receives a delayed response from its 0° output coupled to AND/OR gate 140 and received at its feedback input FDBK. Internally, delay logic loop 130 interprets the delay of this signal as required compensation for all other output signals, in this case namely the 90° output and 270° output signals. AND/OR gate 140 includes four inputs 140A, 140B, 140C and 140D. As seen in FIG. 1, input 140B of AND/OR logic gate 140 couples or ties to a positive voltage supply rail, +V, so that input 140B receives a logic high. The remaining inputs 140C and 140D tie to ground to receive a logic low. AND/OR logic gate 140 generates a buffered or direct throughput function providing a signal delay through the AND/OR function. The output of AND/OR logic gate 140 couples to a feedback input, FDBK, of delay logic loop 130 to provide a compensation delay for all output signals referenced to the 0° signal output of delay logic loop 130 through AND/OR logic gate 140.

Clock divider circuit 100 receives an input signal X_EVEN/ODD at input 100C. Input 100C couples to the input of an inverter 150 and to input 160D of an AND/OR logic gate 160. The inverted output of inverter 150 couples to input 160A of AND/OR gate 160. The output of inverter 150 represents the inverted state of clock divider circuit 100 input signal X_EVEN/ODD. Further, the X_EVEN/ODD input signal describes the even or odd state of the value of X chosen for the divide by X.5 function of Equation 1. The X_EVEN/ODD signal exhibits a logic high for even number values of X and a logic low for odd values of X. The 270° output of delay logic loop 130 couples to input 160B of AND/OR gate 160. The 90° output of delay logic loop 130 couples to input 160C of AND/OR gate 160.

As described above, clock divider circuit 100 receives input signal X_EVEN/ODD at input 100C. The X_EVEN/ODD signal flows to AND/OR gate 160 at input 160A and input 160D as shown. The 270° and 90° outputs of delay logic loop 130 supply delayed input signals to AND/OR logic gate 160 inputs 160B and 160C, respectively. AND/OR logic gate 160 corresponds to a gate delay for the output signals of delay logic loop 130. As described above, AND/OR gate 140 provides the feedback loop for delay logic loop circuit 130. Further, delay logic loop 130 compensates for the delay associated with AND/OR gate 160 in the output path by using gate circuitry topologically identical to AND/OR gate 160 as represented by AND/OR gate 140 coupled to the feedback input FDBK of delay logic loop 130. The feedback input FDBK of delay logic loop 130 effectively eliminates the gate delay logic of AND/OR gate 160 from the output signals of delay logic loop 130 by use of the feedback circuitry associated with delay logic loop devices.

Signal X_EVEN/ODD exhibits a logic high at input 100C of clock divider circuit 100 for applications wherein the divide by X.5 circuit 100 of FIG. 1 employs an integer for X equal to an even number 2, 4, 6, etc. In contrast, signal X_EVEN/ODD supplies a logic low signal to input 100C for applications of divider circuit 100 wherein the divisor X.5 as represented by Equation 1, employs an odd integer X such as 3, 5, 7, etc. (any odd integer greater than 2). In one embodiment now discussed below, the signal X_EVEN/ODD corresponds to an even integer for X. Under these conditions where X corresponds to an even integer, input signal X_EVEN/ODD exhibits a high state at clock divider circuit 100 input 100C. Boolean logic shows that logic gate 160 passes the 90° output signal of delay logic loop 130 at input 160C through to the output of logic gate 160. The signal CLKIN_DEL represents the reference clock CLKIN shifted forward by 90°.

In another embodiment, the signal X_EVEN/ODD input 100C exhibits a low state, such as for a divide by X.5 value wherein X equals an odd numbered integer of 3 or greater. In this scenario, AND/OR logic gate 160 passes the 270° output signal of delay logic loop 130 through to the output of gate 160 thereby generating the CLKIN_DEL signal. The CLKIN_DEL signal represents a reference system clock CLKIN signal delayed or shifted forward by 270 degrees in this example. The selection of either the 90° output or the 270° output of delay logic loop 130 by the X_EVEN/ODD signal determines the proper timing relationships to generate future waveforms in divider circuit 100 as discussed in more detail below. The output of AND/OR gate 160 couples to the positive edge triggered clock input of flip flop 170 and the negative edge triggered clock input of flip flop 180.

Rising edge triggered flip flop 170, triggered by the rising edge of clock signal CLKIN_DEL, generates a clock signal A_DEL. The output of flip flop 170 couples to input 190B of OR-gate 190. Signal A_DEL represents a delayed copy of clock signal A by one rising edge of the reference system clock CLKIN. The falling edge of clock signal CLKIN_DEL triggers falling edge triggered flip flop 180. The output of flip flop 180 generates clock signal B_DEL. Clock signal B_DEL represents a delayed version of clock signal B. The output of flip flop 180 couples to the remaining input 190D of OR-gate 190. OR gate 190 generates the output clock signal CLKOUT of divider circuit 100 at CLKOUT output 100B.

Figure 2:
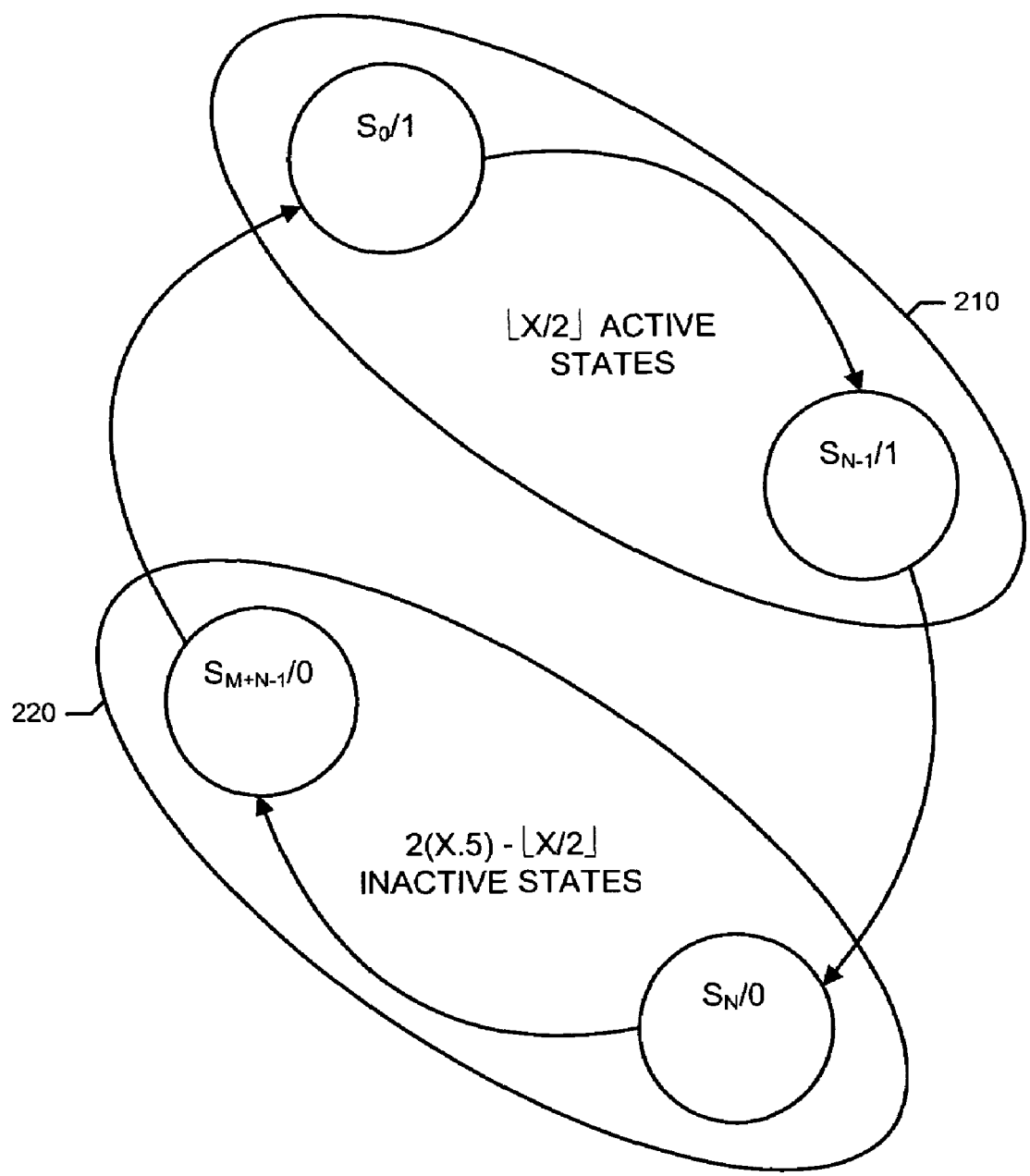
FIG. 2 shows a state machine than may be employed as a variable duty pulse generator in the divider circuit of FIG. 1.

FIG. 2 shows a state machine describing in more detail the state conditions of variable duty-cycle pulse generator 200 of FIG. 1. The input clock signal CLKIN at input 100A provides input to variable duty-cycle pulse generator 200. Further, variable duty-cycle pulse generator 200 generates an output clock signal A at its output. A state machine block 210 describes the active state conditions for variable duty-cycle pulse generator 200. An active state corresponds to a digital high condition for clock signal A. Block 210 describes the initialized state of variable duty-cycle pulse generator 200. Variable X corresponds to an integer value of 2 or greater selected to represent the divisor value in Equation 1 above. The state machine block 210 then further describes the function wherein N, as described in Equation 3 below, equals the mathematical floor of X/2 or the resultant of X/2 reduced to the nearest integer value. This resultant represents the total number of active states or periods where clock signal A exhibits an active high state relative to input reference system clock CLKIN.

$$N = \lfloor X/2 \rfloor \qquad \text{EQUATION 3}$$

Mathematical Floor Function of X/2

When divider circuit 100 employs a value of 3 as an example value of X, then N equates to a resultant integer value of 1. More particularly, as per Equation 3, X/2 or 3/2 produces a result of 1.5 that when reduced or rounded down to the nearest integer yields a value of 1 for N. As described, the resultant of N=1 corresponds to clock signal A exhibiting a high state for 1 clock cycle input of reference system clock signal CLKIN.

In another example, wherein X corresponds to an integer value equal to 4, Equation 3 yields a value of N=2. Again, clock divider circuit 100 divides the frequency of reference system clock CLKIN by X.5, namely 4.5 in this example, per Equation 1. The result of state machine block 210 corresponds to N equal to the mathematical floor of X/2. The final resultant of X/2 (in this example equating to integer value 2) describes the number of active states per block 210 for clock signal A. Further, the resultant value of 2 represents 2 periods that clock signal A exhibits a high state relative to the clock cycle of reference system clock input CLKIN. As this state satisfies, state machine of FIG. 2 enters the next state as defined by a state machine block 220.

State machine block 220 describes the conditions required to generate an inactive state for clock signal A. The inactive state condition of block 220 further describe the conditions such that clock signal A transitions and remains in a digital low or off state. In state machine block 220, value M equates to the relationship given in Equation 4 below:

$$M = 2(X.5) - \lfloor X/2 \rfloor \qquad \text{EQUATION 4}$$

wherein, M represents 2 times X.5 subtracted by the mathematical floor function of X divided by 2. Further, M represents the number of periods associated with input clock signal CLKIN for the case where clock signal A exhibits a low state.

In an example again wherein X equates to integer value 3, the resultant inactive period corresponds to 2 times 3.5 minus 3/2 rounded to the next lowest integer. Further, M equates to integer value 6, per Equation 4 above, namely 7 minus 1. The resultant value of M, which equates to 6, represents 6 clock input cycles of reference system clock signal CLKIN such that clock signal A remains in a low state. A complete cycle combines the results of the two block states of state machine in FIG. 2. More particularly, clock signal A transitions high for 1 input cycle of reference system clock CLKIN and low for 6 input cycle pulses of reference system clock CLKIN. Again, this represents the example where X equates to an integer value equal to 3. The state machine further describes that this sequence resets and that the identical function, with clock signal A transitioning active high as per block 210, initiates a new cycle which repeats indefinitely, providing input reference signal clock CLKIN remains active.

The value of X corresponds to integer 4 in the second of two examples. Block 220 describes the resultant inactive period for clock signal A. Block 220 describes, per Equation 4, a scenario wherein M equal to 2 times 4.5 minus a mathematical floor of 4/2. The resultant for M is 9 minus 2, or 7. The value of M corresponds to 7 clock input cycles of reference system clock signal CLKIN wherein clock signal A transitions and remains in a low state. Combining the two states of FIG. 2, clock signal A can be defined as high for 2 input cycles of reference system clock CLKIN and low for 7 input pulses of CLKIN in this example. The state machine, per block 210, further describes that this sequence resets and repeats the identical function wherein clock signal A transitions to active high and repeats indefinitely. Timing diagrams will further represent this relationship below.

Figure 3:
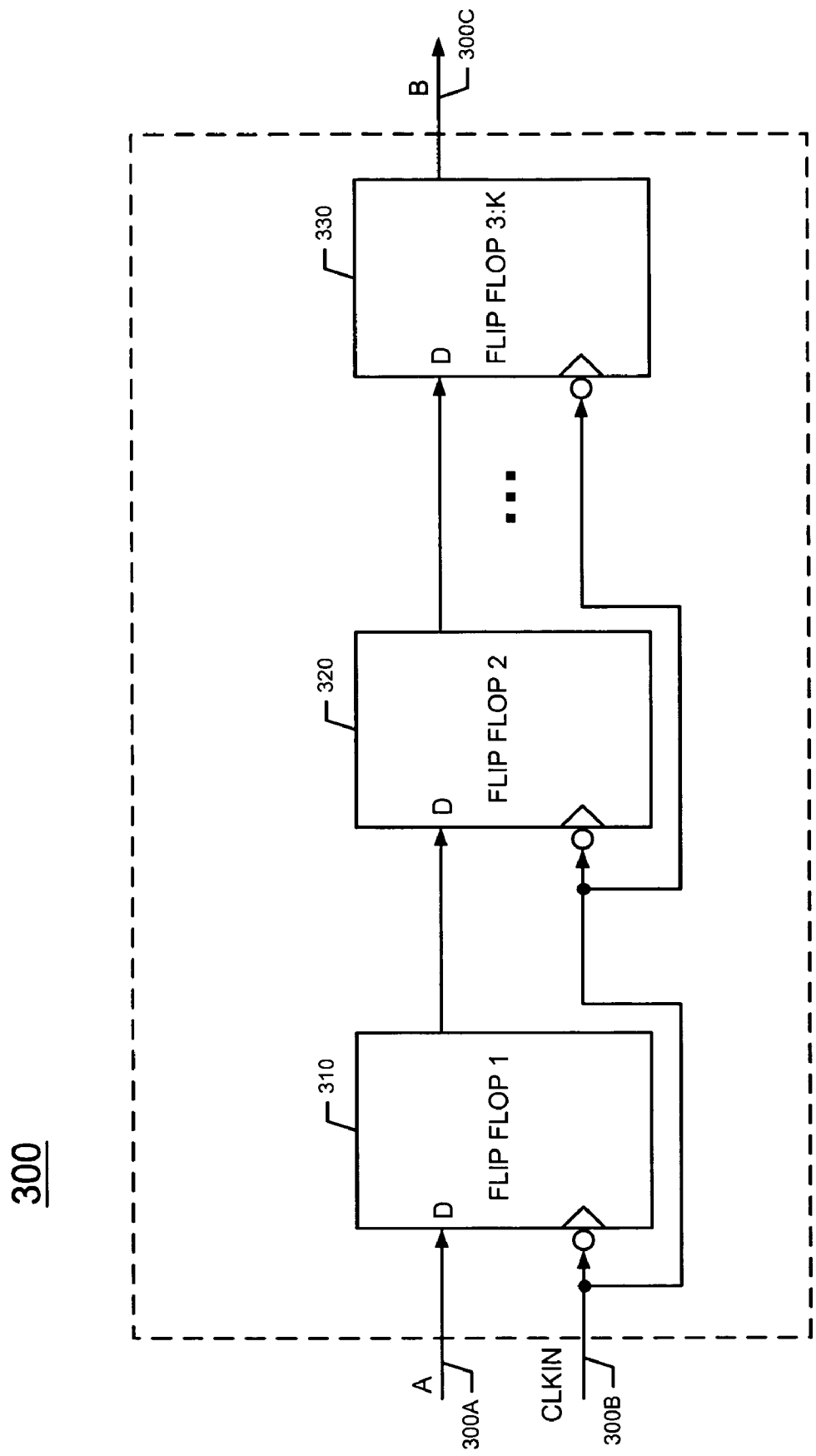
FIG. 3 shows a block diagram of an array of flip flops that may be employed as stage delay logic in the divider circuit of FIG. 1.

FIG. 3 shows one example of multiple flip flops coupled in series or cascaded to form flip flop stage delay logic circuit 300 as seen in FIG. 1. Flip flop stage delay logic circuit 300 receives the reference clock signal, A, at input 300A and the master or reference clock signal, CLKIN, at input 300B. Input 300A, couples to the D input of a falling edge triggered FLIP FLOP 1, namely flip flop 310, to receive the reference clock signal A. Further, the clock input of FLIP FLOP 1 couples to divider circuit input 300B to provide the reference system clock signal CLKIN as the falling edge triggering clock to FLIP FLOP 1. Input 300B, CLKIN, also couples to the clock input of FLIP FLOP 2, namely flip flop 320, and further couples to the clock input of a FLIP FLOP 3:K, namely flip flop 330. FLIP FLOP 3:K represents a third or any number up to a count K of flips flops necessary to satisfy the equation for K as described in Equation 5:

$$K=\lceil X.5 \rceil \qquad \text{EQUATION 5}$$

Mathematical Ceiling Function of X.5 wherein, K (an integer by definition) represents the total numerical count of stage delay flip flops in flip flop stage delay logic 300 of FIG. 1. Further, K represents the total flip flop count to assure the relationship of X as described above in Equation 1. X, in the divisor of Equation 5, corresponds to the divisor variable X in Equation 1. Equation 1 determines the frequency of output clock signal CLKOUT as the frequency of reference system clock CLKIN divided by the divisor X.5.

Continuing with FIG. 3, the output of FLIP FLOP 1 couples to the D input of FLIP FLOP 2. The output of FLIP FLOP 2 couples to the D input of FLIP FLOP 3:K wherein represents the number of flip flops 3 through K as defined by Equation 5. The last flip flop K of the cascade, in this representation FLIP FLOP 3:K, generates reference clock signal B as output clock signal 300C as seen in FIG. 3.

In one example X corresponds to an integer value of 2. K further defines as the mathematical ceiling of 2.5 or in this example a resultant value of 3. By definition per Equation 5, the total number of flip flops required to cascade in flip flop stage delay logic 300 per FIG. 1 equates to 3. Further, in another example X corresponding to an integer value of 3. The total flip flop count in flip flop stage delay logic circuit 300 equates per Equation 5 to a value of 4. For X equal to 4, flip flop stage delay logic circuit 300 corresponds to 5 total flip flops and so on.

Figure 4:
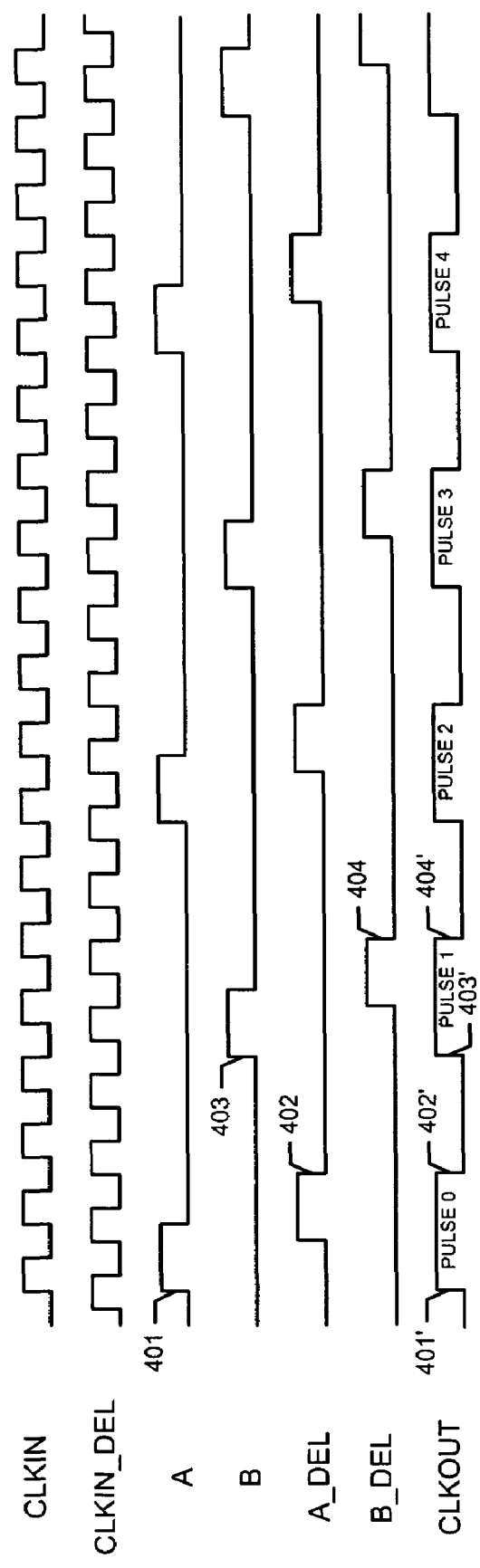
FIG. 4 is a timing diagram depicting selected signals in an embodiment of the disclosed divider circuit wherein the divisor is 3.5.

FIG. 4 shows a timing diagram of amplitude change over time of the CLKIN, CLKIN_DEL, A, B, A_DEL, B_DEL and CLKOUT signals. FIG. 4 depicts operation of divider circuit 100 wherein X corresponds to an integer value of 3 and the divisor of Equation 1 corresponds to 3.5. The timing clock signals of FIG. 4 reference from the system clock CLKIN signal. Reference system clock CLKIN corresponds to an input digital signal with a duty cycle or active high and inactive low state relationship of 50/50. A 50/50 duty cycle corresponds to a common high and a common low period pulse width. Divider circuit 100 generates all clock and reference timing signals from the reference system clock signal, namely the CLKIN signal. Stated alternatively, the timing diagram examples of FIG. 4 result when divider circuit 100 employs a value of 3 for X wherein X describes the divisor variable of X.5 in Equation 1 above. The relationship between the reference system clock signal CLKIN and the output clock signal CLKOUT can be further described as CLKOUT FREQ=CLKIN FREQ/X.5 as per Equation 1 above.

Clock signal CLKIN_DEL duplicates the waveform at reference system clock input CLKIN 100A but shifts that waveform forward in time. More particularly, CLKIN_DEL represents a clock signal of identical frequency and pulse width to reference system clock CLKIN signal shifted in timeframe 270° to the right, namely forward in time. Delay logic loop 130 provides the 270° timing shift in this example. The 270° shift corresponds to 270 of 360 total degrees or a delayed shift right in timing of ¾ of a standard clock cycle. The time between one rising edge of the reference system clock signal CLKIN to the next rising edge of reference system clock signal CLKIN corresponds to a standard clock cycle. In this example, X represents the value 3 and divider circuit 100 interprets this value of X as an odd number. To facilitate this interpretation, an external circuit (not shown) supplies the signal X_EVEN/ODD as a logic low signal to input 100C. In other words, since X corresponds to an odd number in this example, the X_EVEN/ODD signal at 100C in FIG. 1, exhibits a logic low state. When input 100C exhibits a logic low state, this allows the 270° output signal of delay logic loop 130 to pass through AND/OR logic gate 160. AND/OR logic gate 160 generates a clock signal CLKIN_DEL shifted to the right 270° degrees relative to one full cycle, or 360 degrees of the reference system clock signal CLKIN. AND/OR logic gate 140, by providing a compensation delay feedback coupled to feedback input FDBK of delay logic loop 130, matches the output delay of AND/OR logic gate 160. AND/OR logic gate 160 generates clock signal CLKIN_DEL wherein, the relationship between clock signal CLKIN_DEL and reference system clock signal CLKIN can be assured to be a true 270 degrees and not affected by circuit or logic gate delays other than delay logic loop 130.

Clock signal A transitions to an active state, or high, with the initial rising edge of the reference system clock signal CLKIN. As defined by block 210 of the state machine in FIG. 2, clock signal A remains high for a period described by Equation 3 above. Further, Equation 3 describes the mathematical floor function of X/2, or in this example 3/2 rounded down to 1. Additionally, Equation 3 defines the reference clock signal A as exhibiting a high state for 1 full cycle of the reference system clock signal CLKIN. Following the high state for one cycle, clock signal A transitions to a low state.

Clock signal A will remain low as defined by state machine logic in FIG. 2 for a period equal to the resultant of value M per Equation 4 above. M evaluates to 6, or 2 times X.5 minus the resultant of the floor of X/2. More particularly, clock signal A remains inactive in a low state for 6 cycles of the reference system clock signal CLKIN as seen in timing diagram of FIG. 4. Additionally, the frequency of clock signal A can be defined by the relationship expressed by Equation 2 above wherein the frequency of clock signal CLKIN is divided by 2 times X.5. In this example wherein X equals 3, Equation 2 equates to an integer value of 2 times 3.5 or 7. As seen in the timing diagram of FIG. 4, signal A exhibits a frequency 7 times slower than that of the reference input clock signal CLKIN. As per the state machine logic of FIG. 2, the waveform for clock signal A will repeat provided the input reference system clock signal CLKIN remains active.

Clock signal B represents a copy of clock signal A as delayed or shifted forward in time, namely to the right in the timing diagram of FIG. 4, by flip flop stage delay logic 300. As shown in FIG. 3, flip flop stage delay logic 300 employs the number of cascaded flip flops indicated by Equation 5 above. In the example wherein X=3, K equates to the mathematical ceiling function of X.5. Thus X.5 corresponds to 3.5 that when rounded up yields the resultant value for K of 4. The resultant value of K corresponds to a total flip flop count of flip flop stage delay logic 300, namely 4 flip flops. The falling edge of the reference system clock signal CLKIN triggers flip flop delay logic 300. When so triggered, this action clocks the clock signal A state through the flip flop cascade of flip flop delay logic 300. Further, clock signal B transitions high after the fourth occurrence of the clock input signal CLKIN transitioning to a low state. More particularly, clock signal B transitions high when initiated by the transition of signal A to a high state and the occurrence of clock input signal CLKIN triggering. Clock signal B then transitions to a low state after the fourth falling edge occurrence of the reference system clock signal CLKIN and after clock signal A transitions low. The resultant right shifted copy of clock signal A is depicted as clock signal B in the timing diagram of FIG. 4. In this example signal B exhibits a shift of X.5, or 3.5 times the period of the reference system clock signal CLKIN to the right of reference clock signal A.

Rising edge clock triggered flip flop 170 generates the clock signal A_DEL as its output signal. The rising edge of clock signal CLKIN_DEL triggers flip flop 170 with the input of clock signal A data. Clock signal A_DEL, the resultant output of flip flop 170, provides a delayed copy of clock signal A. Clock signal A_DEL is identical to reference clock signal A in pulse width but delayed by the next occurrence of the rising edge of clock signal CLKIN_DEL. Stated alternatively, when clock signal A exhibits a high state, signal A_DEL will transition high following the preceding occurrence of the rising edge of clock signal CLKIN_DEL. Further, as clock signal A transitions low, signal A_DEL transitions low following the next rising edge of CLKIN_DEL signal. Clock signal A_DEL remains low until the next transition of clock signal A to a high state initiates the cycle again. This cycle repeats indefinitely provided reference system clock CLKIN remains active. Clock signal B_DEL follows a similar relationship with respect to CLKIN_DEL as clock signal A_DEL does with respect to clock signal A. More particularly, each occurrence of the falling edge of CLKIN_DEL triggers or clocks flip flop 180 with data input clock signal B. This action generates a duplicate pulse width waveform B_DEL which is effectively clock signal B as delayed by the falling edge of clock signal CLKIN_DEL. Clock signal B_DEL appears at the output of flip flop 180 in FIG. 1.

A combination of signals presented to four inputs of OR-gate 190, namely clock signal A, clock signal B, clock signal A_DEL and clock signal B_DEL result in the generation of the output clock signal CLKOUT 100B as seen in FIG. 1 and the timing diagram of FIG. 4. Note that when any one of the 4 inputs of OR gate 190 exhibits a logic high, the output of OR gate 190 also exhibits a logic high. Thus, when any one of the A, B, A_DEL or B_DEL signals exhibits a logic high, the CLKOUT signal at the output of OR gate 190 exhibits a logic high. Divider circuit 100 employs this logical OR Boolean relationship to construct the CLKOUT signal from the four signals, A, B, A_DEL and B_DEL.

More specifically, again referring to FIG. 4, the rising edge of clock signal A at 401 generates the first rising edge of output clock signal CLKOUT at 401'. Clock signal A_DEL overlaps clock signal A to prevent any potential for OR-gate 190 to lose input continuity and exhibit a loss of signal. The falling edge of A_DEL at 402 represents the first falling edge of the output clock signal CLKOUT at 402'. The next occurrence of clock signal B transitioning high at 403 generates the second rising edge of output clock signal CLKOUT at 403'. The relationship timing between clock signal A and clock signal B exhibits the divide by X.5 condition as described by Equation 1. The relationship between clock signal A and clock signal B represents one cycle of the divided clock frequency CLKOUT as described in FIG. 1 and Equation 1 above. The overlap between clock signal B and clock signal B_DEL again assures no intermediate falling edge data presented to OR-gate 190. Further, the overlap between clock signal B and clock signal B_DEL assures that the falling edge of clock signal B_DEL at 404 clearly defines the falling edge 404' of the second output clock signal CLKOUT pulse. While the above description discussed the generation of the first two clock cycles of the CLKOUT signal in the timing diagram of FIG. 4, the process described may repeat indefinitely until interrupted by the discontinuation of the input reference system clock signal CLKIN. Further, the timing relationships between the clock signal A, the clock signal B, the clock signal A_DEL and the clock signal B_DEL results in an output clock signal CLKOUT that exhibits an ideal 50/50 duty cycle or a duty cycle approximately equal to the ideal 50% duty cycle. As seen in FIG. 4, the output clock signal CLKOUT exhibits a high state for the duration of the period between the rising edge of either clock signal A transitioning high or clock signal B transitioning high. Moreover, the output clock signal CLKOUT transitions to a low state when either clock signal A_DEL transitions low or clock signal B_DEL transitions low.

Figure 5:
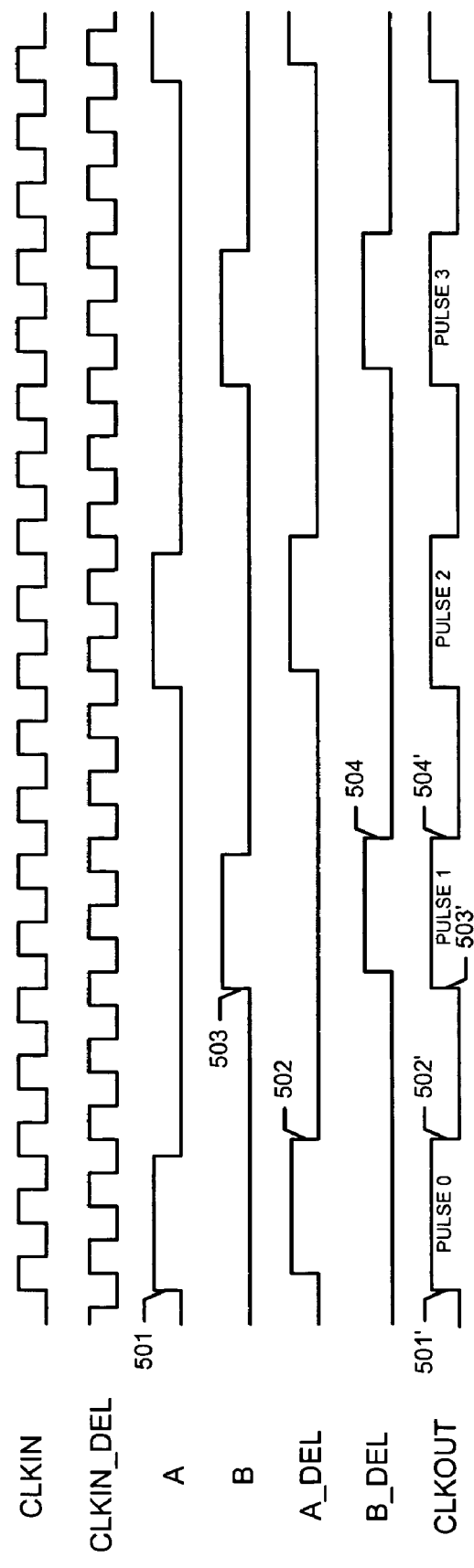
FIG. 5 is a timing diagram depicting selected signals in an embodiment of the disclosed divider circuit wherein the divisor is 4.5.

FIG. 5 shows another timing diagram for waveforms of clock divider circuit 100 when divider circuit 100 employs a divider of 4.5 to generate the output clock signal CLKOUT as per Equation 1 above. Reference system clock signal CLKIN describes a digital signal that exhibits a duty cycle of 50/50 or 50%. In other words, the time during which the CLKIN signal exhibits a logic high equals the time during which the CLKIN signal exhibits a logic low. Divider circuit 100 generates all clock and reference timing signals depicted in FIG. 5 from the reference system clock signal CLKIN. This example employs an integer value of 4 for X, the divisor variable of X.5 in Equation 1 above.

Divider circuit 100 generates the clock signal CLKIN_DEL as a waveform nearly identical to reference input clock signal CLKIN in terms of frequency and pulse width. However, divider circuit 100 shifts or delays the clock signal CLKIN_DEL by 90° in comparison with the reference system clock signal CLKIN. More particularly, delay logic loop 130 shifts the clock signal CLKIN_DEL to the right as seen in the timing diagram of FIG. 5. In this example wherein X equals 4, divider circuit 100 interprets X as an even variable, namely an even integer. To facilitate this interpretation, an external circuit (not shown) supplies the signal X_EVEN/ODD as a logic high signal to input 100C. The logic high X_EVEN/ODD signal passes through inverter 150 which inverts the signal to a logic low to enable the 90° phase shifted output signal of delay logic loop 130 to pass through AND/OR gate 160, while preventing the 270° phase shifted output signal from reaching the output of AND/OR gate 160. Under these conditions, AND/OR logic gate 160 generates a delayed clock signal CLKIN_DEL as seen in diagram of FIG. 5 that exhibits a shift in time to the right of 90° or ¼ of the period of the reference system clock signal CLKIN. As noted above, AND/OR gate 140 is identical to AND/OR gate 160. Delay logic loop output 130 compensates for delay caused by AND/OR gate 160 via a feedback mechanism inside delay logic loop circuit 130 wherein AND/OR gate 140 effectively informs delay logic loop 130 of the delay caused by AND/OR gate 160. More particularly, the 0° output of delay logic loop 130 fed through identical logic AND/OR gate 140 as seen by AND/OR gate 160 provides a timing relationship to compensate or eliminate the delay otherwise incurred by the output signals transitioning through gate logic as seen by AND/OR gate 160. The relationship between the clock signal CLKIN_DEL and the reference system clock signal CLKIN assures a true 90° shift not affected by any additional circuit or logic gate delays.

Clock signal A transitions active high at 501 with the initial rising edge of reference system clock CLKIN. As defined by state machine block 210 in FIG. 2, clock signal A remains high for a period described by Equation 3 above. The active period of block 210 is further defined mathematically as the floor function of X/2 or in this example, namely 4/2 or 2. This resultant value of 2 corresponds to a high state for 2 full clock cycles of the reference system clock signal CLKIN. Following the high state for 2 cycles, clock signal A transitions low and remains in that state as defined by state machine logic in FIG. 2. Block 220 in FIG. 2 defines the inactive state period equal to the resultant of Equation 4 above, or 2 times 4.5 minus the mathematical floor function of 4/2. Equation 4 evaluates to 9 minus 2, or 7 cycles of the reference system clock signal CLKIN wherein signal A transitions to and remains in a low state as seen in timing diagram of FIG. 5. Additionally, the frequency of clock signal A corresponds to the relationship expressed by Equation 2 above, wherein the frequency of clock signal CLKIN divides by the resultant of 2 times X.5 or 2 times 4.5. In this example, Equation 2 yields a value of 9 for A FREQ. As seen in timing diagram FIG. 5, the frequency of signal A exhibits a frequency 9 times slower than that of the reference input clock signal CLKIN. Moreover, as per the state machine logic in FIG. 2, the waveform of clock signal A will repeat provided the input reference system clock signal CLKIN remains active.

Clock signal B effectively corresponds to a copy of clock signal A shifted or delayed in time by flip flop stage delay logic 300. As defined in FIG. 3, flip flop stage delay logic 300 represents the number of flip flops specified by Equation 5 above. In this example, K equals the mathematical ceiling function of X.5 wherein, X equates to 4 and X.5 equates to 4.5 that rounds up to the resultant 5. Further, flip flop stage delay logic 300 corresponds to a total flip flop count of this numerical resultant of K=5, namely 5 flip flops. As indicated in FIG. 5, the falling edge of the reference system clock signal CLKIN gates clock signal A through the flip flop cascade of flip flop stage delay logic 300. Additionally, flip flop stage delay logic 300 triggers clock signal B output 300C high after the fifth occurrence of the falling edge of the reference signal CLKIN. Further, clock signal B transitions to a low state again after the fifth falling edge occurrence of the reference system clock signal CLKIN as measured from the point in time when clock signal A transitions low. FIG. 5 depicts the resultant right shifted copy of clock signal A as clock signal B consistent with the timing relationship described above. This example further describes clock signal B as representing a shift of X.5, or 4.5 times of reference system clock CLKIN to the right of clock signal A.

Flip flop 170 employs the rising edge of the clock signal CLKIN_DEL at its clock input and the clock signal A at its data input to generate the clock signal A_DEL at the output of flip flop 170. Clock signal A_DEL exhibits a pulse width identical to that of clock signal A. However, flip flop 170 shifts or delays the signal A_DEL in time by the first occurrence of the rising edge of the clock signal CLKIN_DEL. Clock signal A_DEL transitions to a low state at 502 in common timing with the rising edge of clock signal CLKIN_DEL. Clock signal A_DEL remains low until the next transition of clock signal A to a high state initiates the cycle again. Clock signal B_DEL follows with the same relationship between clock signal B and CLKIN_DEL, wherein each occurrence of the falling edge of CLKIN_DEL triggers falling edge flip flop 180. Further, flip flop 180 clocks in the clock signal B as its data input and CLKIN_DEL as its clock input. In response, flip flop 180 generates a delayed clock signal B_DEL which is effectively a duplicate pulse width waveform of clock signal B except delayed in time. Moreover, the clock signal B_DEL is further delayed from clock signal B by the falling edge of clock signal CLKIN_DEL at the output of flip flop 180.

OR gate 190 generates the output clock signal CLKOUT as a Boolean OR function of the four clock signals, A, A_DEL, B and B_DEL, respectively supplied to the four inputs of OR-gate 190 as seen in FIG. 1. Referring again to FIG. 5, the rising edge of clock signal A at 501 causes OR gate 190 to generate the first rising edge of the output clock signal CLKOUT at 501'. The clock signal A_DEL at OR gate input 190B overlaps clock signal A to prevent any potential for OR-gate 190 losing input continuity. The falling edge of A_DEL at 502 corresponds to the first falling edge 502' of output clock signal CLKOUT as seen in FIG. 5. When clock signal B transitions high at 503, the output of OR-gate 190 transitions high to generate the second rising edge of the output clock signal CLKOUT at 503'. In summary, OR gate 190 of divider circuit 100 causes the output clock signal CLKOUT to transition to a high state when either clock signal A transitions high, or clock signal B transitions high, as the per timing diagram of per FIG. 1. The overlap, or period of time during which both clock signal B and the B_DEL signal at OR gate input 190D remain high, assures no intermediate falling edge data presented to OR-gate 190. OR-gate 190 ensures that the falling edge of clock signal B_DEL at 504 clearly defines the falling edge of the second output clock signal CLKOUT pulse at 504'. In summary, OR gate 190 of divider circuit 100 causes the output clock signal CLKOUT to transition to a low state when either clock signal A_DEL transitions low, or clock signal B_DEL transitions low as the per timing diagram of per FIG. 1. The methodology described above generates the first two clock cycles or pulse periods of CLKOUT. As seen in the timing diagram in FIG. 5, divider circuit 100 may repeat this methodology indefinitely until interrupted by the discontinuation of the input reference system clock signal CLKIN. Further, the relationship between clock signal A and clock signal B in cooperation with clock signal A_DEL and clock signal B_DEL results in an output signal CLKOUT that achieves an ideal 50/50 duty cycle in one embodiment.

In one embodiment, divider circuit 100 may couple to, or form part of, a digital circuit such as a processor, microprocessor, digital signal processor (DSP), communication device in an information handling system. An information handling system (IHS) typically includes a processor coupled to system memory via a bus. Input and output devices couple to the bus to provide input and output of information for the IHS. Representative information handling systems include desktop, laptop, notebook, server, mainframe and minicomputer systems.

Figure 6:
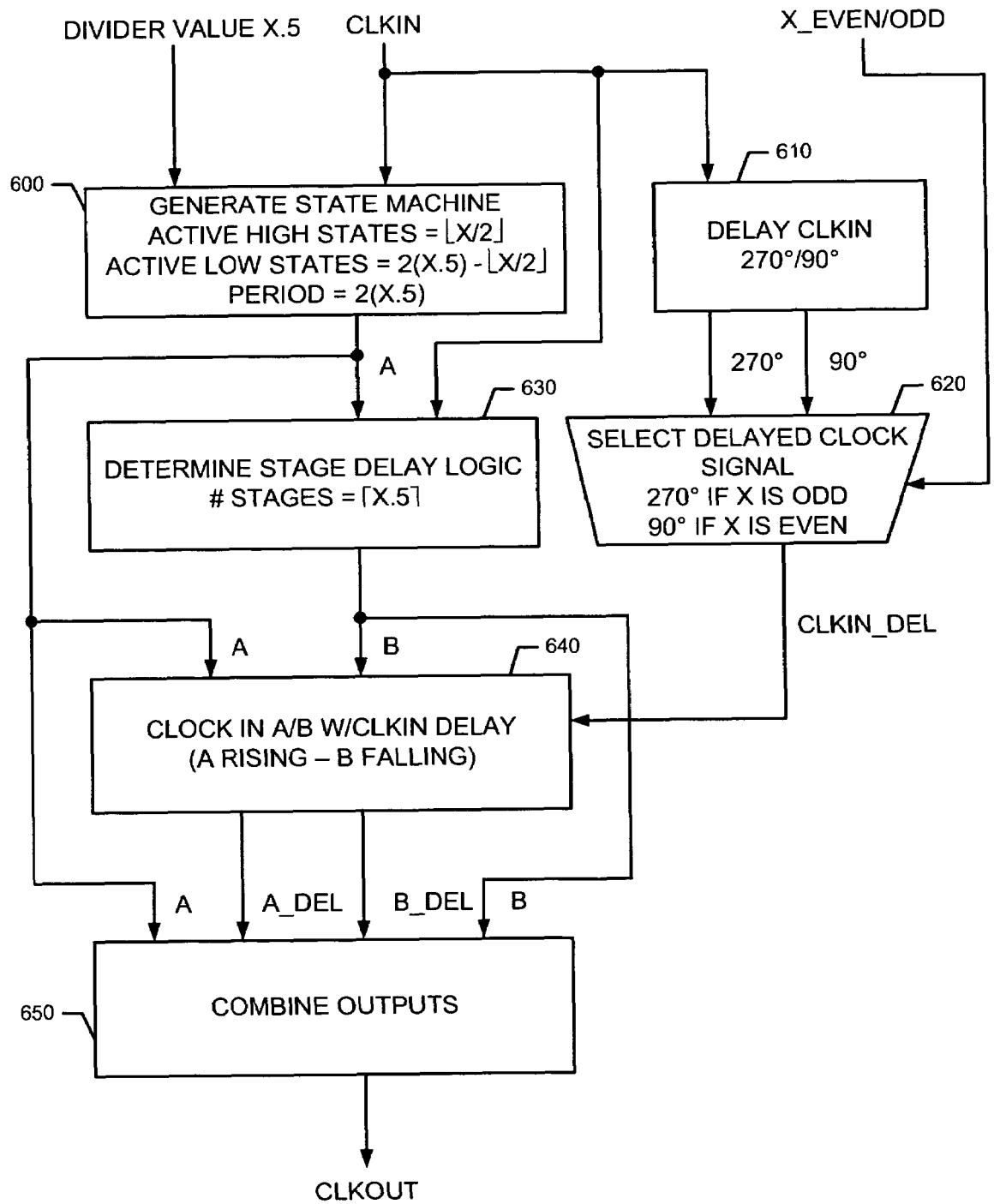
FIG. 6 is a process flow diagram that depicts process flow in one embodiment of the disclosed divider circuit.

FIG. 6 is a process flow diagram that shows process flow in one embodiment of the disclosed divider circuit 100. Variable duty cycle pulse generator 200 receives an input clock signal CLKIN and a divider value (X.5), as per block 600. Variable duty cycle pulse generator 200 generates clock signal A as an output clock signal. Clock signal A remains in an active high state, as described above in reference to block 210 of the state machine of FIG. 2, for a period equal to $\lfloor X/2 \rfloor$ as represented by Equation 3. Clock signal A transitions to an inactive or low state for a period described as $2(X.5) - \lfloor X/2 \rfloor$ per Equation 4. The resultant of $2(X.5)$ defines the total period of clock signal A. Further, $2(X.5)$ defines the summation of the active high and inactive low periods of clock signal A. Delay logic loop 130 receives input clock signal CLKIN as reference, per block 610. Delay logic loop 130 generates both a 270° output and a 90° output clock signal referenced off input clock signal CLKIN 100A. Per block 620, AND/OR logic gate 160 receives delay logic loop 130's generated 270° output and 90° output clock signals. Inverter gate 150 receives input signal X_EVEN/ODD 100C. If X_EVEN/ODD signal exhibits a low state, AND/OR logic gate 160 passes through clock signal 270° 160B which generates clock signal CLKIN_DEL. However, if X_EVEN/ODD signal exhibits a high state, AND/OR logic gate 160 passes through clock signal 90° 160C which generates the clock signal CLKIN_DEL.

Flip flop stage delay logic circuit 300 receives an input clock signal A at input 300A and a reference system clock input signal CLKIN at input 300B, as per block 630 and FIG. 3. The total number of flips flops or stages within flip flop stage delay logic circuit 300 equals $\lceil X.5 \rceil$ per Equation 5. Flip flop stage delay logic circuit 300 generates the output signal clock B at the output of flip flop stage delay logic circuit 300. The rising edge of clock signal CLKIN_DEL triggers clock signal A as input to flip flop 170, and the falling edge of CLKIN_DEL triggers clock signal B as input to flip flop 180, per block 640. Flip flop 170 generates output signal A_DEL as a delayed copy of clock signal A. Moreover, flip flop 180 generates output signal B_DEL as a delayed copy of clock signal B. Clock signal A_DEL and clock signal B_DEL flow to respective inputs of OR-gate 190 per block 650. Further, clock signal A and clock signal B flow to other respective inputs of OR-gate 190 as well. OR-gate 190 combines clock signal A, clock signal B, clock signal A_DEL and clock signal B_DEL using a logic OR operation, as per block 650. In this manner, block 650 generates the output clock signal CLKOUT at the output of divider circuit 100.

Figure 7:
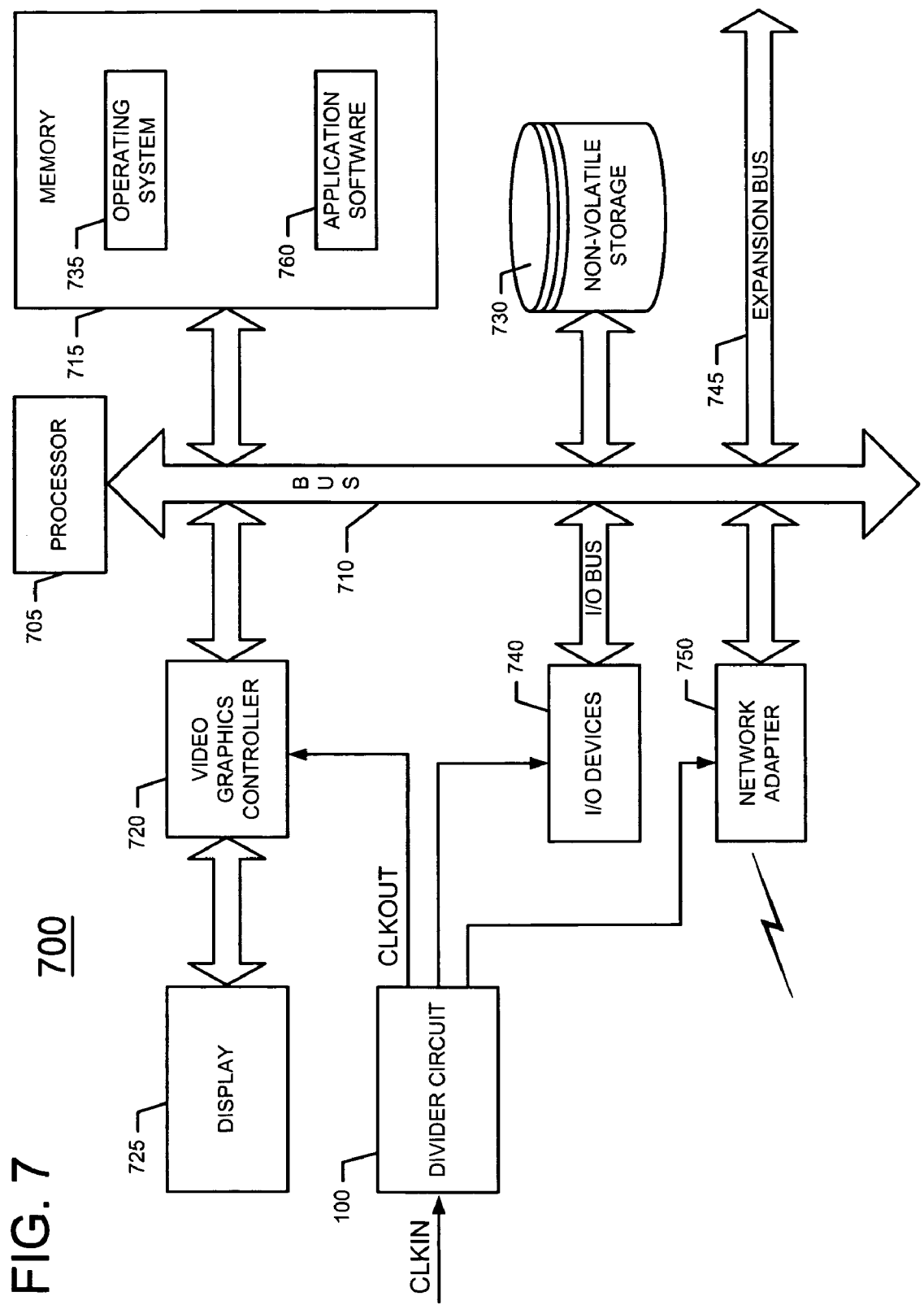
FIG. 7 shows an information handling system including the disclosed divider circuit.

FIG. 7 shows an information handling system (IHS) 700 that includes a divider circuit 100. Divider circuit 100 provides clocking signals to some of the components of IHS 700, such as a processor 705, as described below. IHS 700 further includes a bus 710 that couples processor 705 to system memory 715 and a video graphics controller 720. A display 725 couples to video graphics controller 720. Nonvolatile storage 730, such as a hard disk drive, CD drive, DVD drive, or other nonvolatile storage couples to bus 710 to provide IHS 700 with permanent storage of information. An operating system 735 loads in memory 715 to govern the operation of IHS 700. I/O devices 740, such as a keyboard and a mouse pointing device, couple to bus 710. One or more expansion busses 745, such as USB, IEEE 1394 bus, ATA, SATA, PCI, PCIE and other busses, may couple to bus 710 to facilitate the connection of peripherals and devices to IHS 700. A network adapter 750 couples to bus 710 to enable IHS 700 to connect by wire or wirelessly to a network and other information handling systems. While FIG. 7 shows one IHS that employs processor 700, the IHS may take many forms. For example, IHS 700 may take the form of a desktop, server, portable, laptop, notebook, or other form factor computer or data processing system. IHS 700 may also take on other form factors such as a personal digital assistant (PDA), a gaming device, a portable telephone device, a communication device or other devices that include a processor and memory. In this particular embodiment, divider circuit 100 couples to one or more of video graphics controller 720, I/O devices 740 and network adapter 750 to provide clocking signals thereto. Video graphics controller 720, I/O devices 740 and network adapter 750 act as receptor circuits for these clocking signals.

The foregoing discloses a clock signal divider method and apparatus that, in one embodiment, divides the input reference system clock signal by a divisor of X.5 wherein X represents an integer of 2 or more. In one embodiment, the disclosed method and apparatus maintains an ideal duty cycle reference of 50%, namely 50% high and 50% low or 50/50, for the output clock signal CLKOUT, while maintaining a direct relationship between falling and rising edges of the reference system clock signal CLKIN and the resultant output clock signal CLKOUT.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of processing a signal by a divider circuit, the method comprising:

receiving, by a divider input of the divider circuit, a clock input signal including a plurality of pulses exhibiting a frequency CLKIN FREQ;

generating, by divider logic coupled to the divider input, a clock output signal at a divider output of the divider circuit, the clock output signal including a plurality of pulses exhibiting a clock frequency CLKOUT FREQ, the frequency CLKOUT FREQ being equal to the frequency CLKIN FREQ divided by X.5, wherein X is an integer at least equal to 2, wherein generating the clock output signal further comprises:

generating, by a variable duty cycle pulse generator, a pulse signal A exhibiting a frequency A FREQ according to the relationship A FREQ=CLKIN FREQ/(2×(X.5)), wherein pulse signal A includes a plurality of pulses having rising and falling edges;

generating, by time delay logic, a time delayed copy of pulse signal A which is designated pulse signal B, wherein pulse signal B includes a plurality of pulses having rising and falling edges;

generating, by phase delay logic, a phase delayed copy of signal A and a phase delayed copy of signal B, the phased delayed copies of signal A and signal B being delayed in phase by a predetermined phase amount, wherein the predetermined phase amount is 90° for even values of X and wherein the predetermined phase amount is 270° for odd values of X; and generating, by output logic coupled to the divider output, the clock output signal including a plurality of even and odd pulses, wherein the even and odd pulses include rising edges that are generated in response to rising edges of pulse signal A and pulse signal B, respectively, and wherein the even and odd pulses include falling edges that are generated in response to falling edges of the phase delayed copies of pulse signal A and pulse signal B, respectively.

2. A divider circuit comprising:

a divider input adapted to receive a clock input signal including a plurality of pulses exhibiting a frequency CLKIN FREQ;

a divider output at which a clock output signal including a plurality of pulses exhibiting a clock frequency CLKOUT FREQ is generated, the frequency CLKOUT FREQ being equal to the frequency CLKIN FREQ divided by X.5, wherein X is an integer at least equal to 2;

divider logic, coupled between the divider input and the divider output, the divider logic generating the clock output signal by:

generating, by a variable duty cycle pulse generator, a pulse signal A exhibiting a frequency A FREQ according to the relationship A FREQ=CLKIN FREQ/(2×(X.5)), wherein pulse signal A includes a plurality of pulses having rising and falling edges;

generating, by time delay logic, a time delayed copy of pulse signal A which is designated pulse signal B, wherein pulse signal B includes a plurality of pulses having rising and falling edges;

generating, by phase delay logic, a phase delayed copy of signal A and a phase delayed copy of signal B, the phased delayed copies of signal A and signal B being delayed in phase by a predetermined phase amount, wherein the predetermined phase amount is 90° for even values of X and wherein the predetermined phase amount is 270° for odd values of X; and generating, by output logic coupled to the divider output, the clock output signal including a plurality of even and odd pulses, wherein the even and odd pulses include rising edges that are generated in response to rising edges of pulse signal A and pulse signal B, respectively, and wherein the even and odd pulses include falling edges that are generated in response to falling edges of the phase delayed copies of pulse signal A and pulse signal B, respectively.

3. An information handling system (IHS) comprising:

a processor;

a memory coupled to the processor;

a subsystem coupled to the processor;

a divider circuit, coupled to the subsystem, including:

a divider input adapted to receive a clock input signal including a plurality of pulses exhibiting a frequency CLKIN FREQ;

a divider output at which a clock output signal including a plurality of pulses exhibiting a clock frequency CLKOUT FREQ is generated, the frequency CLKOUT FREQ being equal to the frequency CLKIN FREQ divided by X.5, wherein X is an integer at least equal to 2;

divider logic, coupled between the divider input and the divider output, the divider logic forming the clock output signal by:

generating, by a variable duty cycle pulse generator, a pulse signal A exhibiting a frequency A FREQ according to the relationship A FREQ=CLKIN FREQ/(2×(X.5)), wherein pulse signal A includes a plurality of pulses having rising and falling edges;

generating, by time delay logic, a time delayed copy of pulse signal A which is designated pulse signal B, wherein pulse signal B includes a plurality of pulses having rising and falling edges;

generating, by phase delay logic, a phase delayed copy of signal A and a phase delayed copy of signal B, the phased delayed copies of signal A and signal B being delayed in phase by a predetermined phase amount, wherein the predetermined phase amount is 90° for even values of X and wherein the predetermined phase amount is 270° for odd values of X; and generating, by output logic coupled to the divider output, the clock output signal including a plurality of even and odd pulses, wherein the even and odd pulses include rising edges that are generated in response to rising edges of pulse signal A and pulse signal B, respectively, and wherein the even and odd pulses include falling edges that are generated in response to falling edges of the phase delayed copies of pulse signal A and pulse signal B, respectively.

* * * * *